(12) United States Patent
Lee et al.

(10) Patent No.: US 11,475,847 B2
(45) Date of Patent: Oct. 18, 2022

(54) DISPLAY APPARATUS

(71) Applicant: LG Display Co., Ltd., Seoul (KR)

(72) Inventors: Junggyu Lee, Seoul (KR);
Kyoung-June Jung, Goyang-si (KR);
SangHyun Lim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 17/528,004

(22) Filed: Nov. 16, 2021

(65) Prior Publication Data

US 2022/0157252 A1 May 19, 2022

(30) Foreign Application Priority Data

Nov. 17, 2020 (KR) .......................... 10-2020-0153846

(51) Int. Cl.
*G09G 3/3266* (2016.01)
*G09G 3/3233* (2016.01)
*G09G 3/3291* (2016.01)

(52) U.S. Cl.
CPC ......... *G09G 3/3266* (2013.01); *G09G 3/3291* (2013.01); *G09G 2310/0202* (2013.01); *G09G 2310/061* (2013.01)

(58) Field of Classification Search
CPC ............... G09G 3/3266; G09G 3/3291; G09G 2310/0202; G09G 2310/061;
(Continued)

(56) References Cited

U.S. PATENT DOCUMENTS 10,004,124 B1 * 6/2018 Ko .......................... H05B 33/10
10,522,083 B1 * 12/2019 Li .......................... G09G 3/3291
(Continued)

*Primary Examiner* — Antonio Xavier
(74) *Attorney, Agent, or Firm* — Birch, Stewart, Kolasch & Birch, LLP

(57) ABSTRACT

A display apparatus can include an $N^{th}$ scan driving stage among a plurality of scan driving stages, which outputs an $N^{th}$ scan signal to an $N^{th}$ pixel and an $N+1^{th}$ pixel among the plurality of pixels. Further, an $N+1^{th}$ scan driving stage among the plurality of scan driving stages is configured to output an $N+1^{th}$ scan signal to the $N+1^{th}$ pixel among the plurality of pixels, and a $K^{th}$ reset driving stage among the plurality of reset driving stages is configured to output a $K^{th}$ reset signal to the $N^{th}$ pixel and the $N+1^{th}$ pixel. An anode electrode of a light emitting diode in each of the $N^{th}$ pixel and the $N+1^{th}$ pixel is initialized in accordance with the $K^{th}$ reset signal.

11 Claims, 16 Drawing Sheets

(58) Field of Classification Search
CPC ... G09G 2300/0408; G09G 2300/0819; G09G 2300/0842; G09G 2300/0861; G09G 2310/0262; G09G 2310/0286; G09G 2320/043; G09G 3/3233; G09G 2320/0233; G09G 2320/064; G11C 19/28
See application file for complete search history.

(56) References Cited

U.S. PATENT DOCUMENTS

| | | | |
|---|---|---|---|
| 2015/0002382 A1* | 1/2015 | Cao | G09G 3/3677 345/87 |
| 2016/0210900 A1* | 7/2016 | Kim | G09G 3/3266 |
| 2016/0307509 A1* | 10/2016 | Nie | G09G 3/3241 |
| 2018/0226039 A1* | 8/2018 | Han | G09G 3/3677 |
| 2019/0066598 A1* | 2/2019 | Kim | G09G 3/3258 |
| 2021/0398508 A1* | 12/2021 | Lee | G09G 3/3233 |
| 2022/0108656 A1* | 4/2022 | Lee | G09G 3/3266 |

\* cited by examiner

DISPLAY APPARATUS

CROSS-REFERENCE TO RELATED APPLICATIONS

This application claims priority to Korean Patent Application No. 10-2020-0153846 filed on Nov. 17, 2020, in the Korean Intellectual Property Office, the entire contents of which are hereby expressly incorporated by reference into the present application.

BACKGROUND

Technical Field

The present disclosure relates to a display apparatus, and more particularly, to a display apparatus in which a driving frequency is variable.

Description of the Related Art

Among the display apparatuses, a light emitting display apparatus includes light emitting diodes. The light emitting diode as a self-emitting device includes an anode electrode, a cathode electrode, and an organic compound layer formed therebetween. The organic compound layer is formed of a hole transport layer HTL, an emission layer EML, and an electron transport layer ETL.

When a driving voltage is applied to the anode electrode and the cathode electrode, holes which pass through the hole transport layer HTL and electrons which pass through the electron transport layer ETL form excitons. By doing this, the emission layer EML generates visible rays.

An active matrix type light emitting display apparatus includes light emitting diodes which are self-emitting devices and are used in various ways due to the advantages of a fast response speed, large emission efficiency, luminance, and viewing angle.

The light emitting display apparatus arranges pixels each including a light emitting diode in a matrix, and adjusts the luminance of the pixel in accordance with a gray scale level of video data.

Each pixel includes a driving transistor configured to control a driving current flowing through the light emitting diode in accordance with a voltage between the gate and the source and at least one switching transistor which programs the voltage between the gate and the source of the driving transistor. The driving current is determined by a voltage between the gate electrode and the source electrode of the driving transistor in accordance with the data voltage and a threshold voltage of the driving transistor. The luminance of the pixel is proportional to the magnitude of the driving current flowing through the light emitting diode. The light emitting diode of each pixel emits light based on video data which is programmed at every frame period and the anode electrode of the light emitting diode is initialized using an initialization voltage before programming new video data at every frame period. The initialization voltage supplied to the pixel is supplied through an initial line.

In order to separately supply the initialization voltage to the anode electrode of the light emitting diode, an additional gate driver is needed. As a separate gate driver is added, there can be a limitation in that a bezel area in which the gate driver is disposed can increase.

SUMMARY OF THE DISCLOSURE

The inventors of the present disclosure have invented a display apparatus in which a connection relationship between a gate driver and a pixel is newly designed to minimize the bezel area occupied by the gate driver which supplies the initialization voltage to the anode electrode as described above.

Accordingly, an aspect of the present disclosure is to provide a display apparatus which minimizes a bezel area in which the gate driver is disposed.

Another aspect of the present disclosure is to provide a display apparatus which independently initializes the anode electrode of the light emitting diode.

According to an embodiment of the present disclosure, a display apparatus comprises a display panel including a display area and a non-display area; a plurality of pixels disposed at the display area and including a light emitting diode; and a gate driver disposed at the non-display area and including a plurality of scan driving stages configured to output a scan signal, a plurality of emission driving stages configured to output an emission signal, and a plurality of reset driving stages configured to output a reset signal. An $N^{th}$ scan driving stage among the plurality of scan driving stages is configured to output an $N^{th}$ scan signal to an $N^{th}$ pixel and an N+1-th pixel among the plurality of pixels. An N+1-th scan driving stage among the plurality of scan driving stages is configured to output an $N+1^{th}$ scan signal to the $N+1^{th}$ pixel among the plurality of pixels. A $K^{th}$ reset driving stage among the plurality of reset driving stages is configured to output a $K^{th}$ reset signal to the $N^{th}$ pixel and the $N+1^{th}$ pixel. Here, N and K are natural numbers equal to or larger than 1, respectively. An anode electrode of the light emitting diode in each of the $N^{th}$ pixel and the $N+1^{th}$ pixel is initialized in accordance with the $K^{th}$ reset signal.

According to an embodiment of the present disclosure, the luminance difference which can be caused by changing the driving frequency is suppressed or prevented so that the image quality variation in accordance with the change of the frequency of the display apparatus can be minimized.

Further, according to an embodiment of the present disclosure, an area of the gate driver disposed at a non-display area is reduced so that the bezel area of the display apparatus can be minimized.

Additional features and aspects will be set forth in part in the description that follows, and in part will become apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
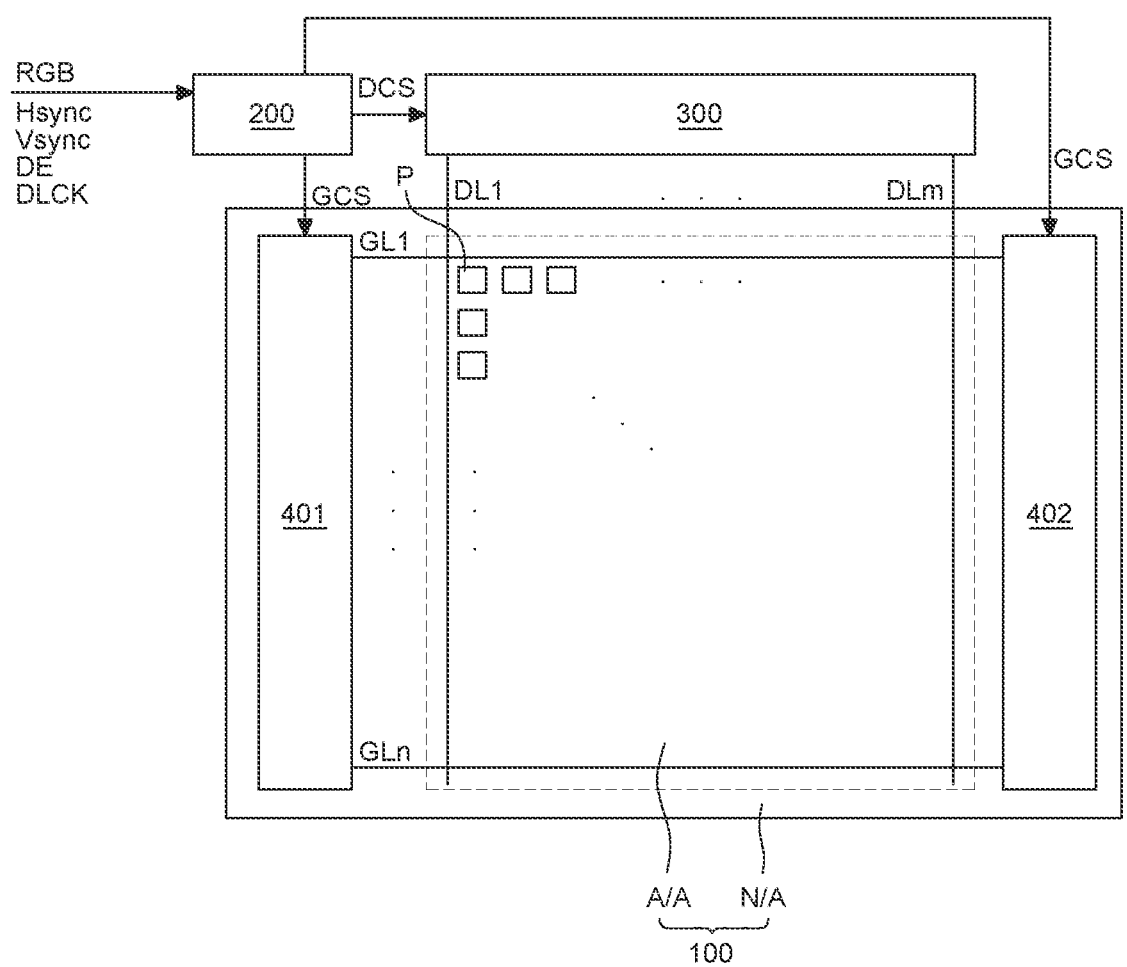
FIG. 1 is a block diagram of a display apparatus according to an embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Advantages and characteristics of the present disclosure, and a method of achieving the advantages and characteristics will be clear by referring to exemplary embodiments described below in detail together with the accompanying drawings. However, the present disclosure is not limited to the exemplary embodiment disclosed herein but will be implemented in various forms. The exemplary embodiments are provided by way of example only so that a person of ordinary skilled in the art can fully understand the disclosures of the present disclosure and the scope of the present invention. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and do not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways, and the embodiments can be carried out independently of or in association with each other.

Hereinafter, the present disclosure will be described in detail with reference to the drawings.

FIG. 1 is a block diagram of a display apparatus according to an embodiment of the present disclosure. All the components of each display apparatus according to all embodiments of the present disclosure are operatively coupled and configured.

With reference to FIG. 1, a display apparatus according to an embodiment of the present disclosure includes a display panel 100, a timing control circuit 200, a data driver 300, and gate drivers 401 and 402.

The display panel 100 can include a display area A/A and a non-display area N/A. In the display area A/A, images are displayed. The non-display area N/A is disposed at the outside of the display area A/A and various signal lines and gate drivers 401 and 402 are disposed therein.

In the display area A/A, to configure to display images, a plurality of pixels P is disposed. In the display area A/A, n gate lines GL1 to GLn are disposed in a first direction and m data lines DL1 to DLm are disposed in a direction different from the first direction, for example, in a second direction. Here, n and m can be natural numbers such as positive integers. The plurality of pixels P is electrically connected to the n gate lines GL1 to GLn and the m data lines DL1 to DLm. Gate voltages and data voltages are applied to the pixels P through the gate lines GL1 to GLn and the data lines DL1 to DLm, respectively. Further, each pixel P implements gray scales by the gate voltage and the data voltage. Accordingly, the image is displayed in the display area A/A by the gray scale displayed by each pixel P.

In the non-display area N/A, various signal lines GL1 to GLn and DL1 to DLm which transmit signals to control the operation of the pixels P disposed at the display area A/A and gate drivers 401 and 402 are disposed.

The timing control circuit 200 transmits an input image signal RGB, which is received from a host system, to the data driver 300.

The timing control circuit 200 generates control signals GCS and DCS for controlling operation timings of the gate drivers 401 and 402 and the data driver 300 using timing signals such as a clock signal DCLK, a horizontal synchronization signal Hsync, a vertical synchronization signal Vsync, and a data enable signal DE which are received together with the image data RGB. In this case, the horizontal synchronization signal Hsync can be a signal indicating a time taken to display one horizontal line of a screen and the vertical synchronization signal Vsync is a signal indicating a time taken to display a screen of one frame. Further, the data enable signal DE is a signal indicating a period when a data voltage is supplied to the pixel P of the display panel 100.

For example, the timing control circuit 200 is applied with the timing signal to output a gate control signal GCS to the gate drivers 401 and 402 and output a data control signal DCS to the data driver 300.

The data driver 300 is applied with the data control signal DCS to output a data voltage to the data lines DL1 to DLm.

For example, the data driver 300 generates a sampling signal in accordance with the data control signal DCS and latches the image data RGB in accordance with the sampling signal to be converted into a data voltage and then supplies the data voltage to the data lines DL1 to DLm in response to a source output enable (SOE) signal.

The data driver 300 can be connected to a bonding pad of the display panel 100 by a chip on glass (COG) method or can be directly disposed on the display panel 100. Alternatively, the data driver 300 can be disposed to be integrated with the display panel 100. Further, the data driver 300 can be disposed by a chip on film (COF) method.

The gate drivers 401 and 402 sequentially supply a scan signal, an emission signal, and a reset signal corresponding to the gate voltage to the gate lines GL1 to GLn, in accordance with the gate control signal GCS.

The gate drivers 401 and 402 are formed independently from the display panel 100 to be electrically connected to the display panel in various ways. However, the gate drivers 401 and 402 of the display apparatus according to an embodiment of the present disclosure is formed as a thin film when a substrate of the display panel 100 is manufactured to be embedded on the non-display area N/A in a gate in panel (GIP) manner, but is not limited thereto.

The gate drivers 401 and 402 can include a first gate driver 401 and a second gate driver 402. The first gate driver 401 and the second gate driver 402 can be disposed on both sides of the display panel 100.

For example, the first gate driver 401 supplies the scan signal and the reset signal to the plurality of pixels P. The first gate driver 401 can include a plurality of scan driving stages and a plurality of reset driving stages. The plurality of scan driving stages supplies the scan signal to the plurality of pixels P and the plurality of reset driving stages supplies the reset signal to the plurality of pixels P.

The second gate driver 402 supplies the scan signal and the emission signal to the plurality of pixels P. The second gate driver 402 can include a plurality of scan driving stages and a plurality of emission driving stages. The plurality of scan driving stages supplies the scan signal to the plurality of pixels P and the plurality of emission driving stages supplies the emission signal to the plurality of pixels P.

Hereinafter, a configuration and a driving method of the plurality of pixels P will be described.

Switch elements which configure each of the plurality of pixels P can be implemented by an n-type or a p-type MOSFET transistor. In the following exemplary embodiment, an n-type transistor will be described as an example, but the present disclosure is not limited thereto.

For example, a transistor is a three-electrode element including a gate electrode, a source electrode, and a drain electrode. The source electrode is an electrode which supplies carriers to the transistor. In the transistor, the carriers flow from the source electrode. The drain electrode is an electrode through which the carriers leave the transistor to the outside. Accordingly, the carrier in the MOSFET flows from the source electrode to the drain electrode. In the case of the n-type MOSFET (NMOS), since the carriers are electrons, in order to allow the electrons to flow from the source electrode to the drain electrode, a voltage of the source electrode is lower than a voltage of the drain electrode.

In the n-type MOSFET, since the electrons flow from the source electrode to the drain electrode, the current flows from the drain electrode to the source electrode. In the case of the p-type MOSFET (PMOS), since the carriers are holes, in order to allow the holes to flow from the source electrode to the drain electrode, a voltage of the source electrode is higher than a voltage of the drain electrode. In the p-type MOSFET, since the holes flow from the source electrode to the drain electrode, the current flows from the source electrode to the drain electrode. However, it should be noted that the source electrode and the drain electrode of the MOSFET are not fixed. For example, the source electrode and the drain electrode of the MOSFET can be changed depending on the applied voltage. In the following exemplary embodiment, the contents of the specification are not limited by the source electrode and the drain electrode.

Figure 2:
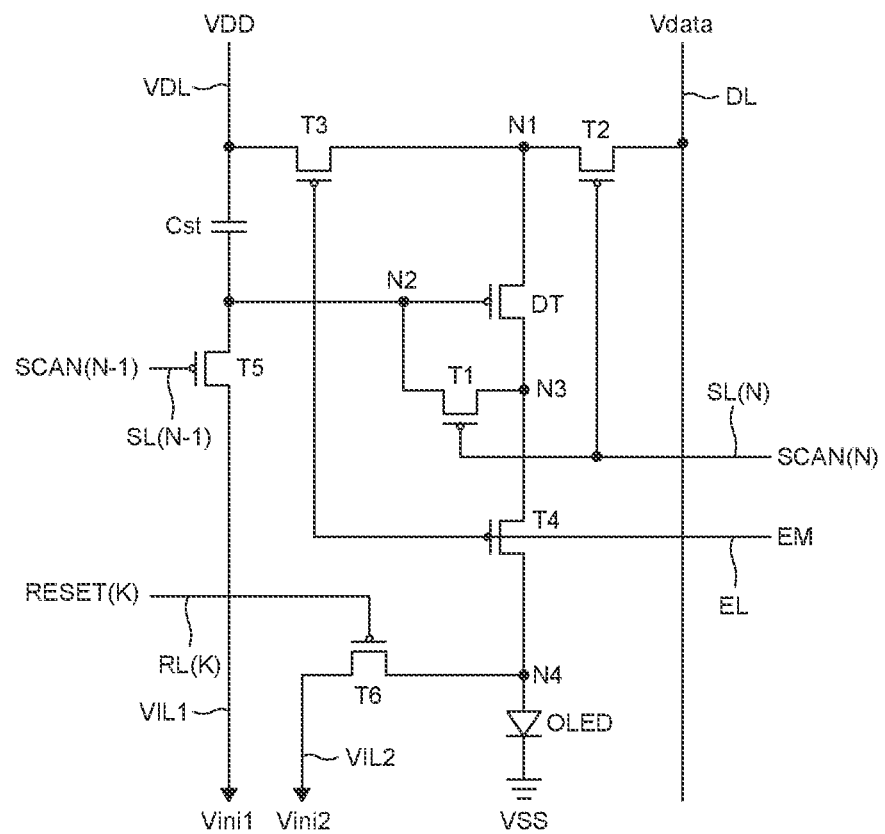
FIG. 2 is a circuit diagram of a pixel of a display apparatus according to an embodiment of the present disclosure.

FIG. 2 is a circuit diagram of a pixel of a display apparatus according to an embodiment of the present disclosure. Each pixel P in FIG. 1 can have the configuration of the pixel in FIG. 2.

Referring to FIG. 2, each pixel P in the display apparatus includes a light emitting diode OLED, a driving transistor DT, first to sixth transistors T1 to T6, and a capacitor Cst.

The light emitting diode OLED emits light by a driving current supplied from the driving transistor DT. A multilayered organic compound layer can be disposed between the anode electrode and the cathode electrode of the light emitting diode OLED. The organic compound layer includes at least one a hole transfer layer and an electron transfer layer, and an emission layer EML. Here, the hole transfer layer is a layer which injects or transfers holes to the emission layer and for example, can include a hole injection layer HIL, a hole transport layer HTL, and an electron blocking layer EBL. The electron transfer layer is a layer which injects or transfers the electrons to the emission layer and for example, can include an electron transport layer ETL, an electron injection layer EIL, and a hole blocking layer HBL. An anode electrode of the light emitting diode OLED is connected to a fourth node N4 and a cathode electrode of the light emitting diode is connected to an input terminal of a low potential driving voltage VSS.

The driving transistor DT controls a driving current applied to the light emitting diode OLED in accordance with its source-gate voltage Vsg. A source electrode of the driving transistor DT is connected to a first node N1, a gate electrode is connected to a second node N2, and a drain electrode is connected to a third node N3.

The first transistor T1 includes a source electrode connected to the third node N3, a drain electrode connected to the second node N2, and a gate electrode connected to an $N^{th}$ scan line SL(N). The first transistor T1 forms a diode connection between the gate electrode and the drain electrode of the driving transistor DT, in response to an $N^{th}$ scan signal SCAN(N).

The second transistor T2 includes a source electrode connected to the data line DL, a drain electrode connected to the first node N1, and a gate electrode connected to the $N^{th}$ scan line SL(N). Accordingly, the second transistor T2 applies a data voltage Vdata supplied from the data line DL to the first node N1 which is the source electrode of the driving transistor DT, in response to the $N^{th}$ scan signal SCAN(N).

The third transistor T3 includes a source electrode connected to a high potential driving voltage line VDL, a drain electrode connected to the first node N1, and a gate electrode connected to the emission line EL. Accordingly, the third transistor T3 applies the high potential driving voltage VDD to the first node N1 which is the source electrode of the driving transistor DT, in response to the emission signal EM.

The fourth transistor T4 includes a source electrode connected to the third node N3, a drain electrode connected to the fourth node N4, and a gate electrode connected to the emission line EL. The fourth transistor T4 forms a current path between the third node N3 which is the source electrode of the fourth transistor T4 and the fourth node T4 which is the drain electrode of the fourth transistor T4, in response to the emission signal EM. Accordingly, the fourth transistor T4 forms a current path between the driving transistor DT and the light emitting diode OLED in response to the emission signal EM.

The fifth transistor T5 includes a drain electrode connected to the second node N2, a source electrode connected to a first initialization voltage line VIL1, and a gate electrode connected to the $N-1^{th}$ scan line SL(N-1). The fifth transistor T5 applies a first initialization voltage Vini1 to the second node N2 which is the gate electrode of the driving transistor DT, in response to the $N-1^{th}$ scan signal SCAN(N-1).

The sixth transistor T6 includes a drain electrode connected to the fourth node N4, a source electrode connected to a second initialization voltage line VIL2, and a gate electrode connected to a $K^{th}$ reset line RL(K). The sixth transistor T6 applies a second initialization voltage Vini2 to the fourth node N4 in response to a $K^{th}$ reset signal RESET(K).

The storage capacitor Cst includes a first electrode connected to the second node N2 and a second electrode connected to the high potential driving voltage line VDL.

Figure 3:
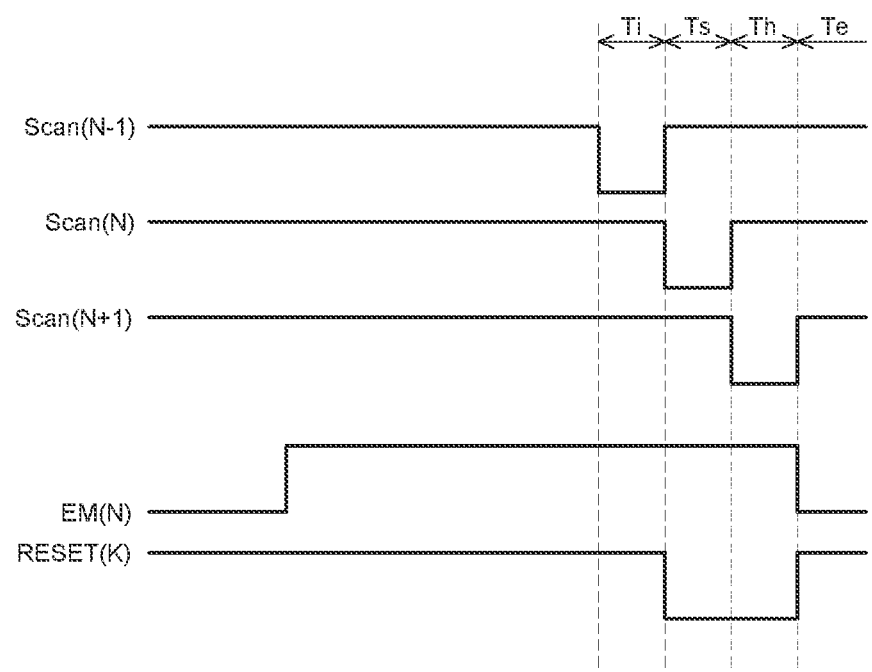
FIG. 3 is a waveform illustrating a gate voltage and voltages of a first node and a second node of a display apparatus according to an embodiment of the present disclosure.

FIG. 3 is a waveform illustrating a gate voltage of a display apparatus according to an embodiment of the present disclosure.

Figure 4A:
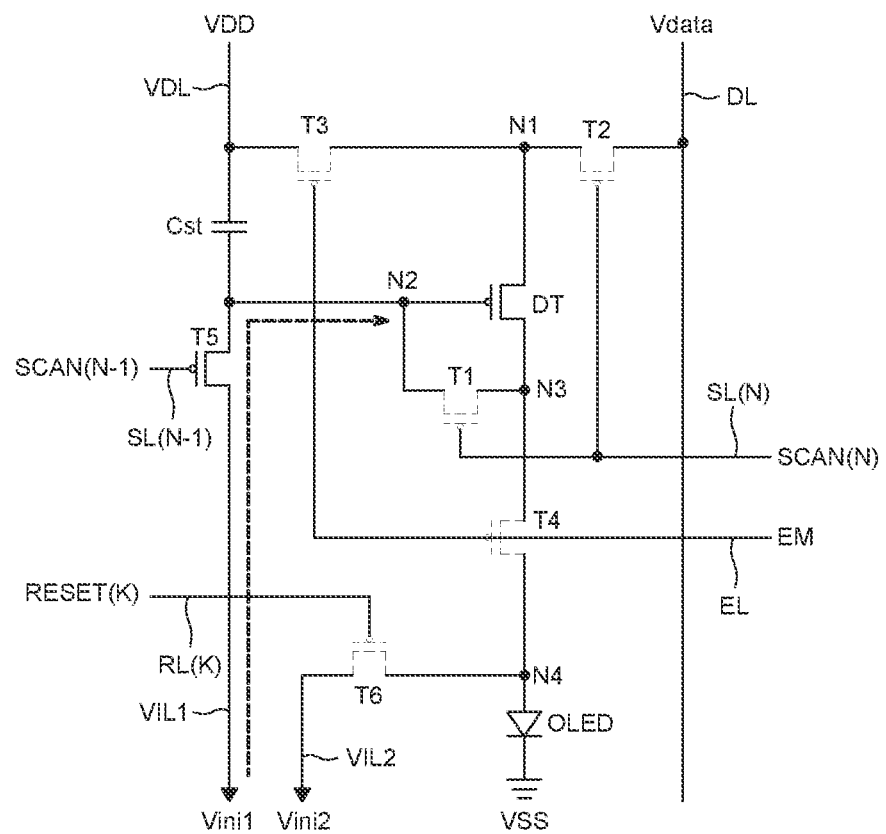
FIG. 4A is a circuit diagram of a pixel of a display apparatus according to an embodiment of the present disclosure during an initial period.
Figure 4B:
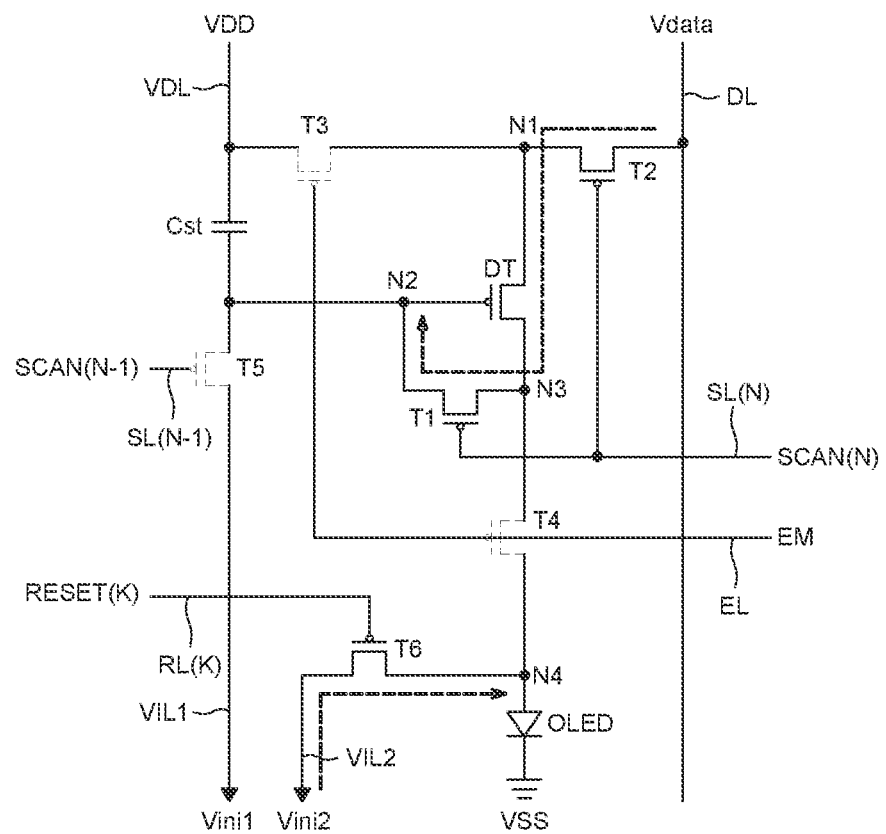
FIG. 4B is a circuit diagram of a pixel of a display apparatus according to an embodiment of the present disclosure during a sampling period.
Figure 4C:
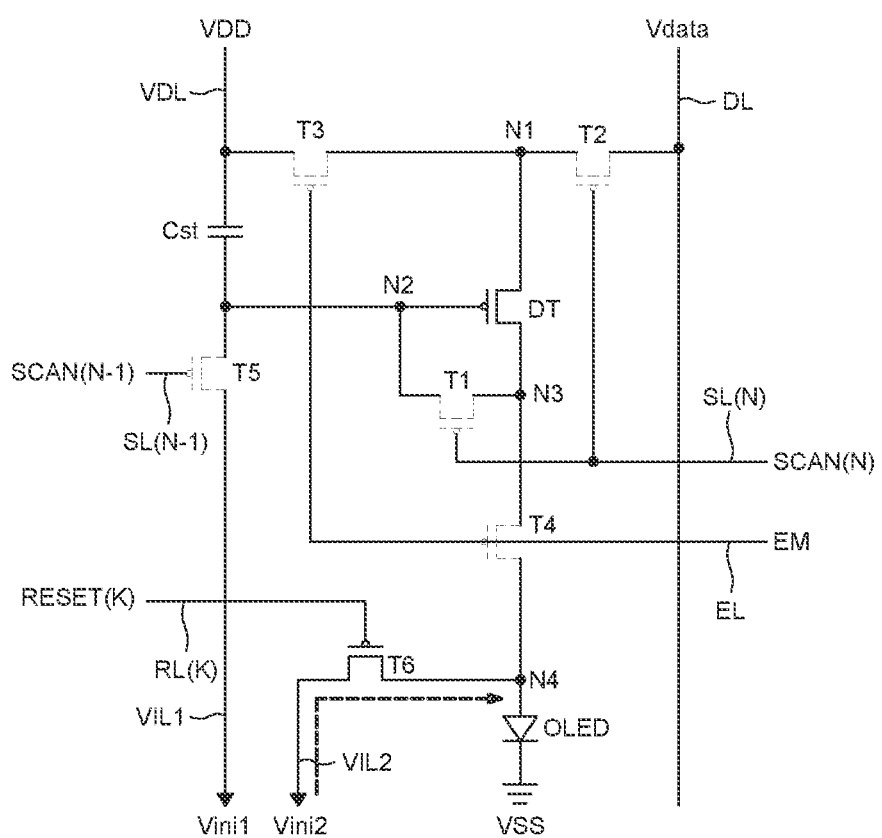
FIG. 4C is a circuit diagram of a pixel of a display apparatus according to an embodiment of the present disclosure during a holding period.
Figure 4D:
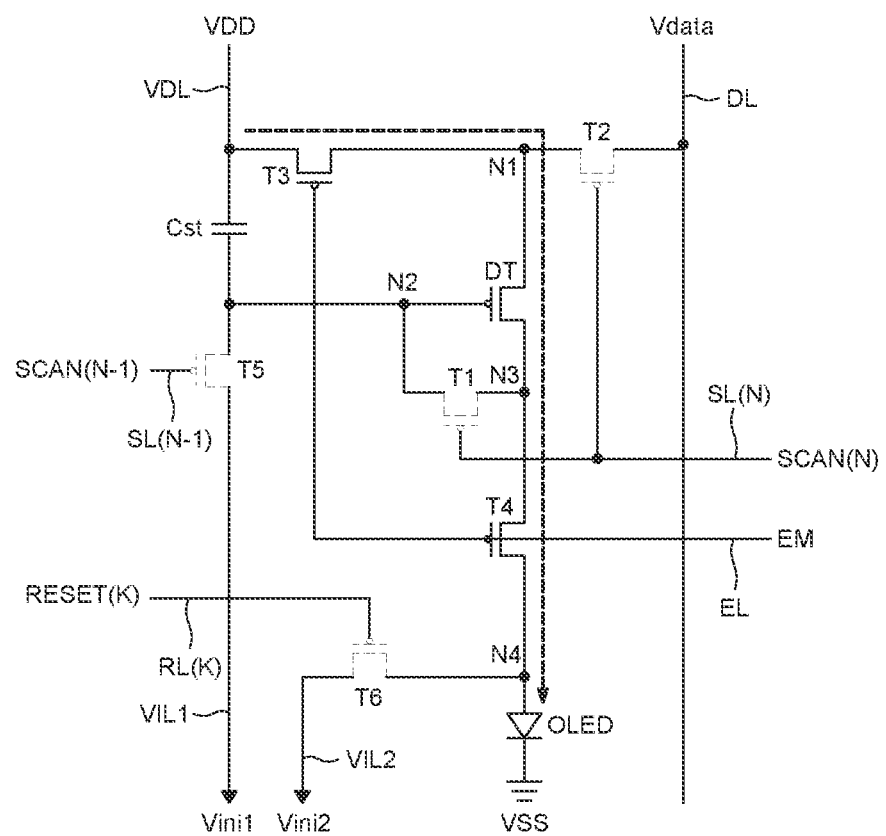
FIG. 4D is a circuit diagram of a pixel of a display apparatus according to an embodiment of the present disclosure during an emission period.

Further, FIG. 4A is a circuit diagram of a pixel of a display apparatus according to an embodiment of the present disclosure during an initial period. FIG. 4B is a circuit diagram of a pixel of a display apparatus according to an embodiment of the present disclosure during a sampling period. FIG. 4C is a circuit diagram of a pixel of a display apparatus according to an embodiment of the present disclosure during a holding period. FIG. 4D is a circuit diagram of a pixel of a display apparatus according to an embodiment of the present disclosure during an emission period.

With reference to FIGS. 2 to 4D, the driving of the display apparatus according to an embodiment of the present disclosure will be described as follows.

In the display apparatus according to an embodiment of the present disclosure, one frame period can include an initial period Ti, a sampling period Ts, a holding period Th, and an emission period Te. The initial period Ti is a period in which the voltage of the second node N2 which is the gate electrode of the driving transistor DT is initialized. The sampling period Ts is a period in which a threshold voltage of the driving transistor DT is sampled. The holding period Th is a period in which a source-gate voltage of the driving transistor DT is maintained. The emission period Te is a period in which the light emitting diode OLED emits light in accordance with the driving current by the source-gate voltage of the programmed driving transistor DT.

In the display apparatus according to an embodiment of the present disclosure, during at least one of the initial period Ti, the sampling period Ts, and the holding period Th, the anode electrode of the light emitting diode OLED can be initialized independently from the initialization of the gate electrode of the driving transistor DT.

For example, with respect to the $N^{th}$ pixel, during the sampling period Ts and the holding period Th, the anode electrode of the light emitting diode OLED can be initialized independently from the initialization of the gate electrode of the driving transistor DT.

Hereinafter, the operation in the initial period Ti, the sampling period Ts, the holding period Th, and the emission period Te with respect to the $N^{th}$ pixel will be described in detail.

For example, with reference to FIGS. 3 and 4A, during the initial period Ti, the $N-1^{th}$ scan signal SCAN(N-1) is a turn-on level. Therefore, the fifth transistor T5 is turned on to apply the first initialization voltage Vini1 to the second node N2. Accordingly, the gate electrode of the driving transistor DT is initialized with the first initialization voltage Vini1. The first initialization voltage Vini1 can be selected in a voltage range which is sufficiently lower than an operating voltage of the light emitting diode OLED and can be equal to or lower than a low potential driving voltage VSS. Further, during the initial period Ti, a data voltage Vdata of a previous frame is maintained at the first node N1.

With reference to FIGS. 3 and 4B, during the sampling period Ts, the $K^{th}$ reset signal RESET(K) is a turn-on level. Therefore, the sixth transistor T6 is turned on to apply the second initialization voltage Vini2 to the fourth node N4. Accordingly, the anode electrode of the light emitting diode OLED is initialized with the second initialization voltage Vini2.

During the sampling period Ts, the $N^{th}$ scan signal SCAN(N) is a turn-on level and the second transistor T2 is turned on to apply the data voltage Vdata supplied from the data line DL to the first node N1. Further, the first transistor T1 is also turned on so that the driving transistor DT forms a diode connection. Therefore, the gate electrode and the drain electrode of the driving transistor DT are shorted so that the driving transistor DT operates as a diode.

During the sampling period Ts, a current Ids flows between the source electrode and the drain electrode of the driving transistor DT. The gate electrode and the drain electrode of the driving transistor DT form the diode connection so that the voltage of the second node N2 gradually rises by the current flowing from the source electrode to the drain electrode. During the sampling period Ts, the voltage of the second node N2 is charged with the voltage Vdata-Vth corresponding to the difference between the data voltage Vdata and the threshold voltage Vth of the driving transistor DT.

With reference to FIGS. 3 and 4C, during the holding period Th, the $K^{th}$ reset signal RESET(K) is continuously a turn-on level. Therefore, the sixth transistor T6 is turned on to apply the second initialization voltage Vini2 to the fourth node N4. Accordingly, the anode electrode of the light emitting diode OLED is initialized with the second initialization voltage Vini2. For example, the anode electrode can be initialized with the second initialization voltage Vini2 by the swing of the fourth node N4.

Further, during the holding period Th, the voltage of the second node N2 which is previously charged is maintained at the voltage Vdata-Vth corresponding to the difference between the data voltage Vdata and the threshold voltage Vth of the driving transistor DT.

With reference to FIGS. 3 and 4D, during the emission period Te, the emission signal EM is a turn-on level so that the third transistor T3 is turned on to apply the high potential driving voltage VDD to the first node N1. The fourth transistor T4 is also turned on to form a current path of the third node N3 and the fourth node N4. Accordingly, a driving current Ioled passing through the source electrode and the drain electrode of the driving transistor DT is applied to the light emitting diode OLED.

A relational expression of the driving current Ioled flowing through the light emitting diode OLED during the emission period Te is represented by the following Equation 1.

$$Ioled = k/2(Vgs+|Vth|)^2 = k/2(Vg-Vs+|Vth|)^2 = k/2(Vdata-|Vth|-VDD+|Vth|)^2 = k/2(Vdata-VDD)^2 \quad \text{[Equation 1]}$$

In Equation 1, k/2 is a proportional factor determined by an electron mobility of the driving transistor DT, a parasitic capacitance, a channel capacity, and the like.

As seen from Equation 1, it is understood that in the relational expression of the driving current Ioled, a component of the threshold voltage Vth of the driving transistor DT is eliminated so that even though in the display apparatus of the present disclosure, the threshold voltage Vth changes, the driving current Ioled does not change. As described above, the display apparatus by the present disclosure can program the data voltage regardless of the variation of the threshold voltage Vth during the sampling period Ts.

As described above, with respect to the $N^{th}$ pixel, the $N-1^{th}$ scan signal SCAN(N-1) is a turn-on level only during the initial period Ti and the $N^{th}$ scan signal SCAN(N) is a turn-on level only during the sampling period Ts. In contrast, the $K^{th}$ reset signal RESET(K) is a turn-on level during both the initial period Ti and the sampling period Ts.

Accordingly, the horizontal period of the $K^{th}$ reset signal RESET(K) can be twice the horizontal period of the $N-1^{th}$ scan signal SCAN(N-1) and the $N^{th}$ scan signal SCAN(N).

A period from a timing when the emission signal EM is a high level which is a turn-off level to a timing when the initial period Ti of the $N^{th}$ pixel starts (for example, a timing when the $N-1^{th}$ scan signal SCAN(N-1) is a low level which is a turn-on level) can be a period in which the $N-1^{th}$ pixel P(N-1) disposed in a previous row of the $N^{th}$ pixel P(N) is initialized and sampled.

Figure 5:
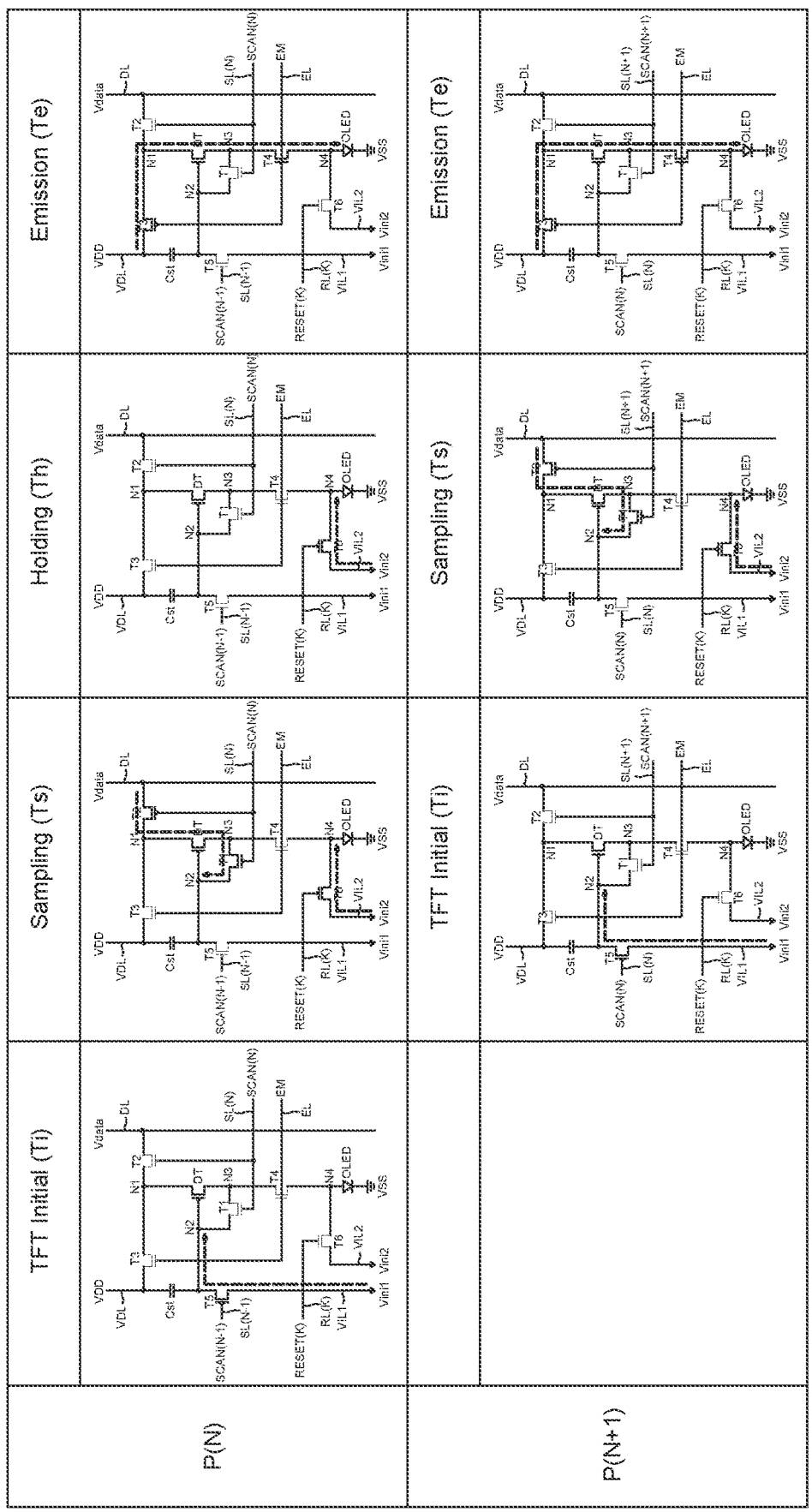
FIG. 5 is a view for explaining operations of an $N^{th}$ pixel and an $N+1^{th}$ pixel according to an embodiment of the present disclosure.

FIG. 5 is a view for explaining operations of an $N^{th}$ pixel and an $N+1^{th}$ pixel according to an embodiment of the present disclosure.

With reference to FIG. 5, with respect to the $N^{th}$ pixel P(N) and the $N+1^{th}$ pixel P(N+1) disposed in a next row of the $N^{th}$ pixel P(N), the initial period Ti, the sampling period Ts, the holding period Th and the emission period Te are distinguished as follows.

During the initial period Ti of the $N^{th}$ pixel P(N), the N-1th scan signal SCAN(N-1) is a turn-on level. The gate electrode of the driving transistor DT of the $N^{th}$ pixel P(N) is initialized with the first initialization voltage Vini1.

Next, during the sampling period Ts of the $N^{th}$ pixel P(N) and the initial period Ti of the $N+1^{th}$ pixel P(N+1), the $N^{th}$ scan signal SCAN(N) is a low level which is a turn-on level.

Accordingly, during the sampling period Ts of the $N^{th}$ pixel P(N) and the initial period Ti of the $N+1^{th}$ pixel P(N+1), the anode electrode of the light emitting diode OLED of the $N^{th}$ pixel P(N) is initialized with the second initialization voltage Vini2. Further, the voltage of the second node N2 of the $N^{th}$ pixel P(N) is charged with a voltage Vdata-Vth corresponding to the difference between the data voltage Vdata and the threshold voltage Vth of the driving transistor DT.

Further, during the sampling period Ts of the $N^{th}$ pixel P(N) and the initial period Ti of the $N+1^{th}$ pixel P(N+1), the gate electrode of the driving transistor DT of the $N+1^{th}$ pixel P(N+1) is initialized with the first initialization voltage Vini1.

In other words, during the sampling period Ts of the $N^{th}$ pixel P(N), the $N^{th}$ scan signal SCAN(N) is a turn-on level so that the sampling period Ts of the $N^{th}$ pixel P(N) can overlap the initial period Ti of the N+1-th pixel P(N+1).

Next, during the holding period Th of the $N^{th}$ pixel P(N) and the sampling period Ts of the $N+1^{th}$ pixel P(N+1), the $N+1^{th}$ scan signal SCAN(N+1) is a low level which is a turn-on level.

Accordingly, during the holding period Th of the $N^{th}$ pixel P(N) and the sampling period Ts of the $N+1^{th}$ pixel P(N+1), the anode electrode of the light emitting diode OLED of the $N^{th}$ pixel P(N) is initialized with the second initialization voltage Vini2.

Further, during the holding period Th of the $N^{th}$ pixel P(N) and the sampling period Ts of the $N+1^{th}$ pixel P(N+1), the anode electrode of the light emitting diode OLED of the $N+1^{th}$ pixel P(N+1) is initialized with the second initialization voltage Vini2. Further, the voltage of the second node N2 of the $N+1^{th}$ pixel P(N+1) is charged with a voltage Vdata-Vth corresponding to the difference between the data voltage Vdata and the threshold voltage Vth of the driving transistor DT.

In other words, during the holding period Th of the $N^{th}$ pixel, the $N+1^{th}$ scan signal SCAN(N+1) is a turn-on level so that the holding period Th of the N-th pixel can overlap the sampling period Ts of the $N+1^{th}$ pixel.

Next, during the emission period Te of the $N^{th}$ pixel P(N) and the emission period Te of the $N+1^{th}$ pixel P(N+1), the emission signal EM is a low level which is a turn-on level so that the $N^{th}$ pixel P(N) and the $N+1^{th}$ pixel P(N+1) simultaneously emit light.

As described above, with reference to the $N+1^{th}$ pixel, during the initial period Ti and the sampling period Ts, the anode electrode of the light emitting diode OLED can be initialized independently from the initialization of the gate electrode of the driving transistor DT.

Hereinafter, a connection relationship of the first gate driver 401 and the plurality of pixels P(N) and P(N+1) and a gate voltage will be described.

Figure 6:
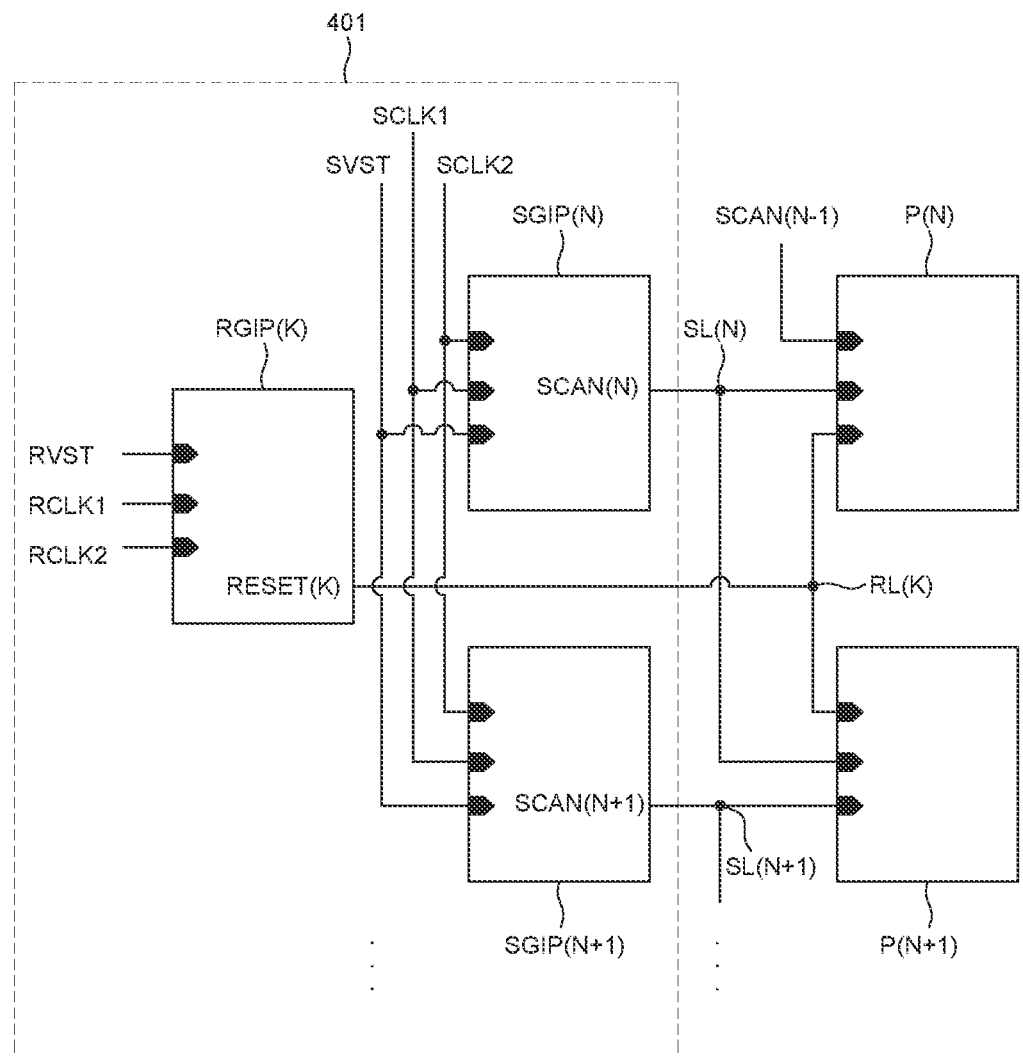
FIG. 6 is a view illustrating a connection relationship of a gate driver and a plurality of pixels of a display apparatus according to an embodiment of the present disclosure.

FIG. 6 illustrates a connection relationship of a gate driver and a plurality of pixels of a display apparatus according to an embodiment of the present disclosure.

For example, in FIG. 6, connection relationships of a $K^{th}$ reset driving stage RGIP(K), an $N^{th}$ scan driving stage SGIP(N), and an $N+1^{th}$ scan driving stage SGIP(N+1) included in the first gate driver 401 and the $N^{th}$ pixel P(N) and the $N+1^{th}$ pixel P(N+1) are illustrated.

As illustrated in FIG. 6, the first gate driver 401 can include the $K^{th}$ reset driving stage RGIP(K), the $N^{th}$ scan driving stage SGIP(N), and the $N+1^{th}$ scan driving stage SGIP(N+1).

The $N^{th}$ scan driving stage SGIP(N) outputs an $N^{th}$ scan signal SCAN(N) to the $N^{th}$ pixel P(N) and the $N+1^{th}$ pixel P(N+1) through the $N^{th}$ scan line SL(N). For example, the $N^{th}$ scan driving stage SGIP(N) is applied with a scan start signal SVST, a first scan clock signal SCLK1, and a second scan clock signal SCLK2 to output the $N^{th}$ scan signal SCAN(N).

The $N+1^{th}$ scan driving stage SGIP(N+1) outputs an $N+1^{th}$ scan signal SCAN(N+1) to the $N+1^{th}$ pixel P(N+1) through the $N+1^{th}$ scan line SL(N+1). For example, the $N+1^{th}$ scan driving stage SGIP(N+1) is applied with the scan start signal SVST, the first scan clock signal SCLK1, and the second scan clock signal SCLK2 to output the $N+1^{th}$ scan signal SCAN(N+1).

The $K^{th}$ reset driving stage RGIP(K) outputs a $K^{th}$ reset signal RESET(K) to the $N^{th}$ pixel P(N) and the $N+1^{th}$ pixel P(N+1) through a $K^{th}$ reset line RL(K), respectively. For example, the $K^{th}$ reset driving stage RGIP(K) is applied with the reset start signal RVST, the first reset clock signal RCLK1, and the second reset clock signal RCLK2 to output the $K^{th}$ reset signal RESET(K).

For example, the $N^{th}$ scan driving stage SGIP(N) and the $N+1^{th}$ scan driving stage SGIP(N+1) can correspond to the $N^{th}$ pixel P(N) and the $N+1^{th}$ pixel P(N+1), respectively. One $K^{th}$ reset driving stage RGIP(K) can correspond to two pixels, the $N^{th}$ pixel P(N) and the $N+1^{th}$ pixel P(N+1). Accordingly, the number of the plurality of scan driving stages can be twice the number of the plurality of reset driving stages.

Figure 7:
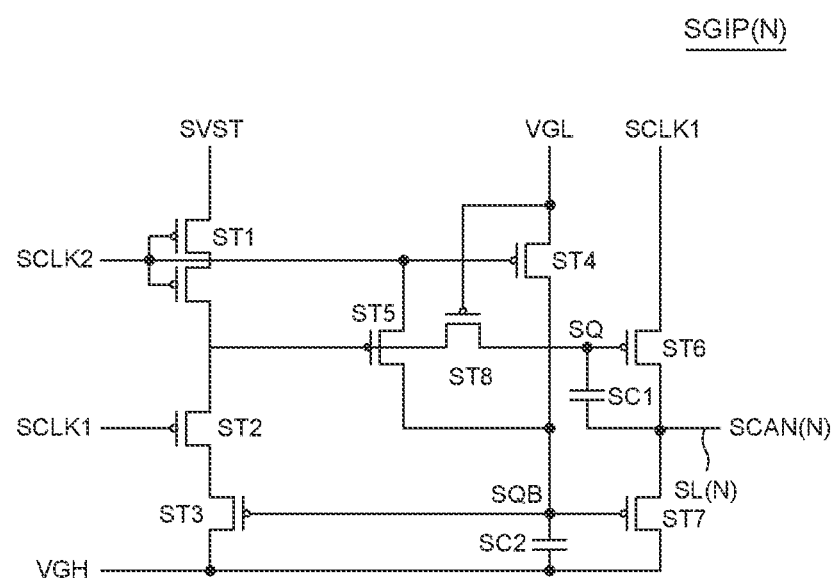
FIG. 7 is a circuit diagram of an $N^{th}$ scan driving stage of a display apparatus according to an embodiment of the present disclosure.

FIG. 7 is a circuit diagram of an $N^{th}$ scan driving stage of a display apparatus according to an embodiment of the present disclosure.

With reference to FIG. 7, the $N^{th}$ scan driving stage SGIP(N) includes first to eighth scan transistors ST1 to ST8, a first reset capacitor SC1, and a second reset capacitor SC2.

The first reset capacitor SC1 can be connected to an SQ node SQ and a line through which a gate low voltage VGL is applied and the second reset capacitor SC2 is connected to an SQB node SQB and a line through which a gate high voltage VGH is applied.

The first scan transistor ST1 includes a source electrode to which the scan start signal SVST is applied, a drain electrode which is connected to the SQ node SQ, and a gate electrode to which the second scan clock signal SCLK2 is applied. The first scan transistor ST1 discharges the SQ node SQ in response to the second scan clock signal SCLK2.

The second scan transistor ST2 includes a source electrode which is connected to the third scan transistor ST3, a drain electrode which is connected to the SQ node SQ, and a gate electrode to which the first scan clock signal SCLK1 is applied. The second scan transistor ST2 charges the SQ node SQ in response to the first scan clock signal SCLK1.

The third scan transistor ST3 includes a source electrode to which a gate high voltage VGH is applied, a drain electrode which is connected to the second scan transistor ST2, and a gate electrode which is connected to the SQB node SQB. The third scan transistor ST3 applies the gate high voltage VGH to the second scan transistor ST2 in response to the voltage of the SQB node SQB.

The fourth scan transistor ST4 includes a source electrode to which the gate low voltage VGL is applied, a drain electrode connected to the SQB node SQB, and a gate electrode to which the second scan clock signal SCLK2 is applied. The fourth scan transistor ST4 discharges the SQB node SQB in response to the second scan clock signal SCLK2.

The fifth scan transistor ST5 includes a source electrode to which the second scan clock signal SCLK2 is applied, a drain electrode which is connected to the SQB node SQB, and a gate electrode which is connected to the SQ node SQ. The fifth scan transistor ST5 charges or discharges the SQB node SQB in response to the voltage of the SQ node SQ.

The sixth scan transistor ST6 includes a source electrode to which the first scan clock signal SCLK1 is applied, a drain electrode which is connected to the $N^{th}$ scan line SL(N), and a gate electrode which is connected to the SQ node SQ. The sixth scan transistor ST6 outputs the first scan clock signal SCLK1 as the $N^{th}$ scan signal SCAN(N) in response to the voltage of the SQ node SQ.

The seventh scan transistor ST7 includes a source electrode to which a gate high voltage VGH is applied, a drain electrode which is connected to the $N^{th}$ scan line SL(N), and a gate electrode which is connected to the SQB node SQB. The seventh scan transistor ST7 outputs the gate high voltage VGH as the $N^{th}$ scan signal SCAN(N) in response to the voltage of the SQB node SQB.

The eighth scan transistor ST8 includes a source electrode which is connected to the SQ node SQ, a drain electrode which is connected to the first scan transistor ST1 and the second scan transistor ST2, and a gate electrode to which the gate low voltage VGL is applied. When the SQ node SQ is bootstrapped, the eighth scan transistor ST8 does not allow the voltage of the SQ node SQ to be applied to the first scan transistor ST1 and the second scan transistor ST2 to protect the first scan transistor ST1 and the second scan transistor ST2.

Figure 8:
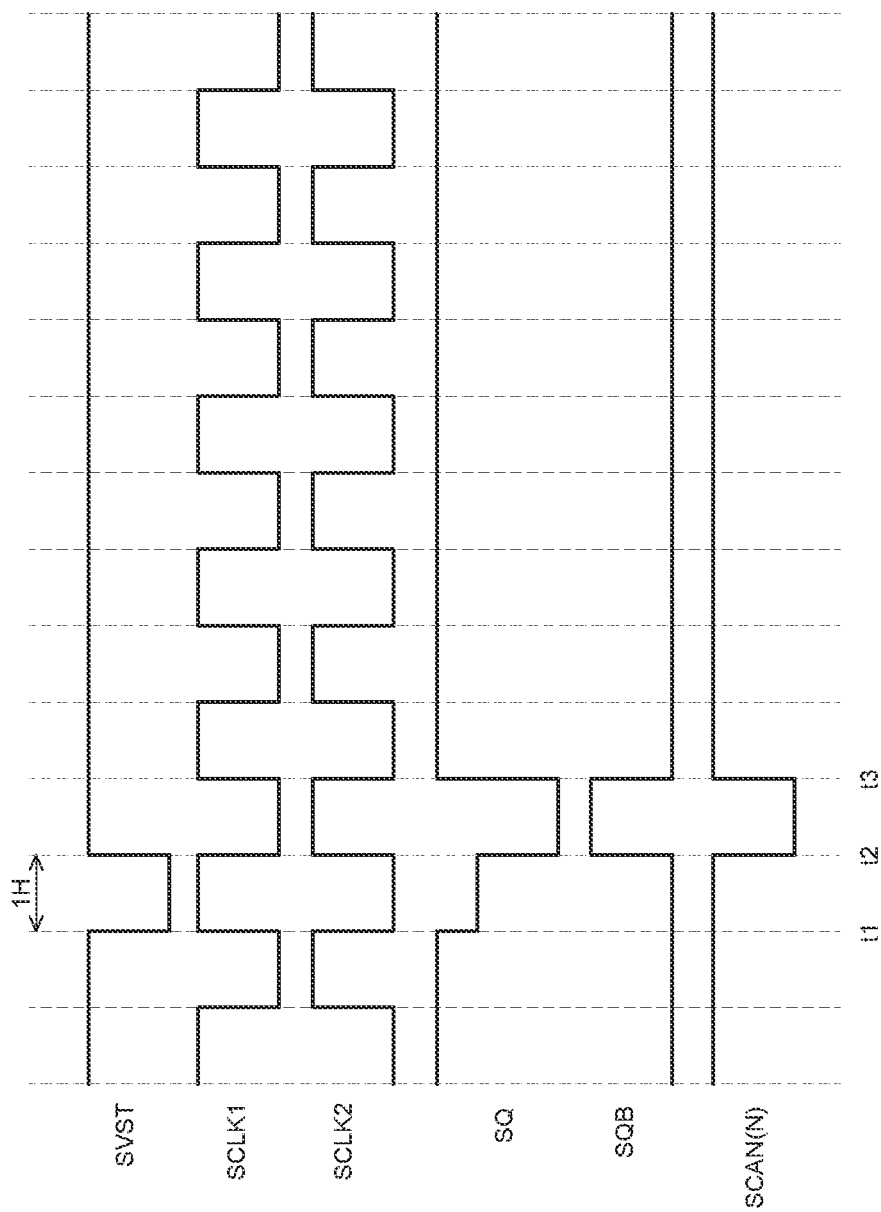
FIG. 8 is a timing chart of an input signal and an output signal of an $N^{th}$ scan driving stage of a display apparatus according to an embodiment of the present disclosure.

FIG. 8 is a timing chart of an input signal and an output signal of an $N^{th}$ scan driving stage of a display apparatus according to an embodiment of the present disclosure.

With reference to FIGS. 7 and 8, a driving method of the $N^{th}$ scan driving stage SGIP(N) will be described in detail.

At a first timing t1, the scan start signal SVST is a low level which is a turn-on level and the second scan clock signal SCLK2 is a low level which is a turn-on level. Therefore, the first scan transistor ST1 is turned on so that the SQ node SQ is discharged to a low level which is a turn-on level. Further, the fourth scan transistor ST4 is turned on so that the SQB node SQB is discharged to a low level which is a turn-on level.

As the SQ node SQ is discharged to a low level which is a turn-on level, the fifth scan transistor ST5 is also turned on so that the SQB node SQB is discharged to a low level which is a turn-on level.

At a second timing t2, the first scan clock signal SCLK1 is a low level which is a turn-on level. Therefore, the SQ node SQ is bootstrapped so that the sixth scan transistor ST6 is turned on and a low level $N^{th}$ scan signal SCAN(N) can be output to the $N^{th}$ scan line SL(N).

To be more specific, when the first scan clock signal SCLK1 is discharged to a low level at the second timing t2, due to the coupling by the parasitic capacitance of the source electrode of the sixth scan transistor ST6 and the SQ node SQ which is the gate electrode, the voltage of the SQ node SQ drops in accordance with the voltage drop of the first scan clock signal SCLK1. The phenomenon that the voltage of the SQ node SQ drops at the second timing t2 is referred to as bootstrapping.

As described above, the SQ node SQ is bootstrapped so that the sixth scan transistor ST6 is fully turned on and a low level $N^{th}$ scan signal SCAN(N) can be output to the $N^{th}$ scan line SL(N).

Subsequently, at a third timing t3, the second scan clock signal SCLK2 is a low level which is a turn-on level. Therefore, the first scan transistor ST1 is turned on so that the SQ node SQ is charged to a high level which is a turn-off level. Further, the fourth scan transistor ST4 is turned on so that the SQB node SQB is discharged to a low level which is a turn-on level.

Therefore, the SQB node SQB is discharged to the low level which is a turn-on level so that the seventh scan transistor ST7 is turned on and a high level $N^{th}$ scan signal SCAN(N) is output to the $N^{th}$ scan line SL(N).

Figure 9:
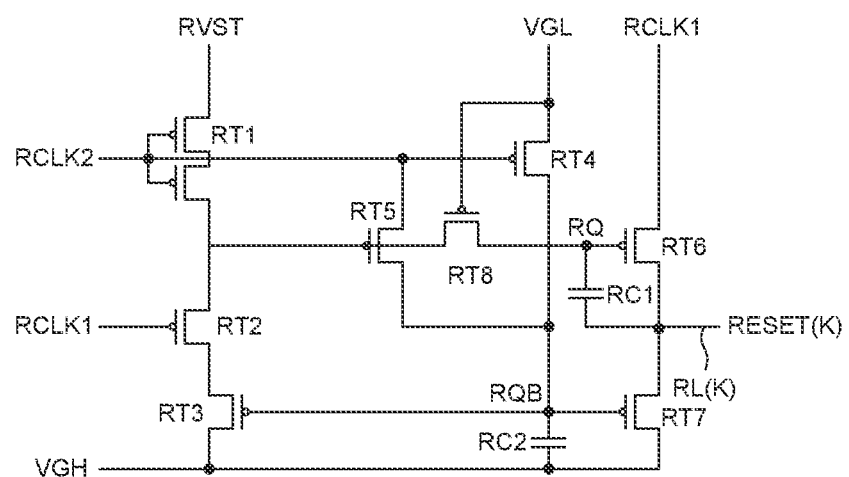
FIG. 9 is a circuit diagram of an $N^{th}$ scan driving stage of a display apparatus according to an embodiment of the present disclosure.

FIG. 9 is a circuit diagram of a $K^{th}$ reset driving stage of a display apparatus according to an embodiment of the present disclosure.

With reference to FIG. 9, the $K^{th}$ reset driving stage RGIP(K) includes first to eighth reset transistors RT1 to RT8, a first reset capacitor RC1, and a second reset capacitor RC2.

The first reset capacitor RC1 can be connected to an RQ node RQ and a line through which a gate low voltage VGL is applied and the second reset capacitor RC2 is connected to an RQB node RQB and a line through which a gate high voltage VGH is applied.

The first reset transistor RT1 includes a source electrode to which a reset start signal RVST is applied, a drain electrode connected to the RQ node RQ, and a gate electrode to which the second reset clock signal RCLK2 is applied. The first reset transistor RT1 discharges the RQ node RQ in response to the second reset clock signal RCLK2.

The second reset transistor RT2 includes a source electrode which is connected to the third reset transistor RT3, a drain electrode which is connected to the RQ node RQ, and a gate electrode to which the first reset clock signal RCLK1 is applied. The second reset transistor RT2 charges the RQ node RQ in response to the first reset clock signal RCLK1.

The third reset transistor RT3 includes a source electrode to which a gate high voltage VGH is applied, a drain electrode which is connected to the second reset transistor RT2, and a gate electrode which is connected to the RQB node RQB. The third reset transistor RT3 applies the gate high voltage VGH to the second reset transistor RT2 in response to the voltage of the RQB node RQB.

The fourth reset transistor RT4 includes a source electrode to which the gate low voltage VGL is applied, a drain electrode connected to the RQB node RQB, and a gate electrode to which the second reset clock signal RCLK2 is applied. The fourth reset transistor RT4 discharges the RQB node RQB in response to the second reset clock signal RCLK2.

The fifth reset transistor RT5 includes a source electrode to which the second reset clock signal RCLK2 is applied, a drain electrode which is connected to the RQB node RQB, and a gate electrode which is connected to the RQ node RQ.

The fifth reset transistor RT5 charges or discharges the RQB node RQB in response to the voltage of the RQ node RQ.

The sixth reset transistor RT6 includes a source electrode to which the first reset clock signal RCLK1 is applied, a drain electrode which is connected to the $K^{th}$ reset line RL(K), and a gate electrode which is connected to the RQ node RQ. The sixth reset transistor RT6 outputs the first reset clock signal RCLK1 as the $K^{th}$ reset signal RESET(K) in response to the voltage of the RQ node RQ.

The seventh reset transistor RT7 includes a source electrode to which a gate high voltage VGH is applied, a drain electrode which is connected to the $K^{th}$ reset line RL(K), and a gate electrode which is connected to the RQB node RQB. The seventh reset transistor RT7 outputs the gate high voltage VGH as the $K^{th}$ reset signal RESET(K) in response to the voltage of the RQB node RQB.

The eighth reset transistor RT8 includes a source electrode which is connected to the RQ node RQ, a drain electrode which is connected to the first reset transistor RT1 and the second reset transistor RT2, and a gate electrode to which the gate low voltage VGL is applied. When the RQ node RQ is bootstrapped, the eighth reset transistor RT8 does not allow the voltage of the RQ node RQ to be applied to the first reset transistor RT1 and the second reset transistor RT2 to protect the first reset transistor RT1 and the second reset transistor RT2.

Figure 10:
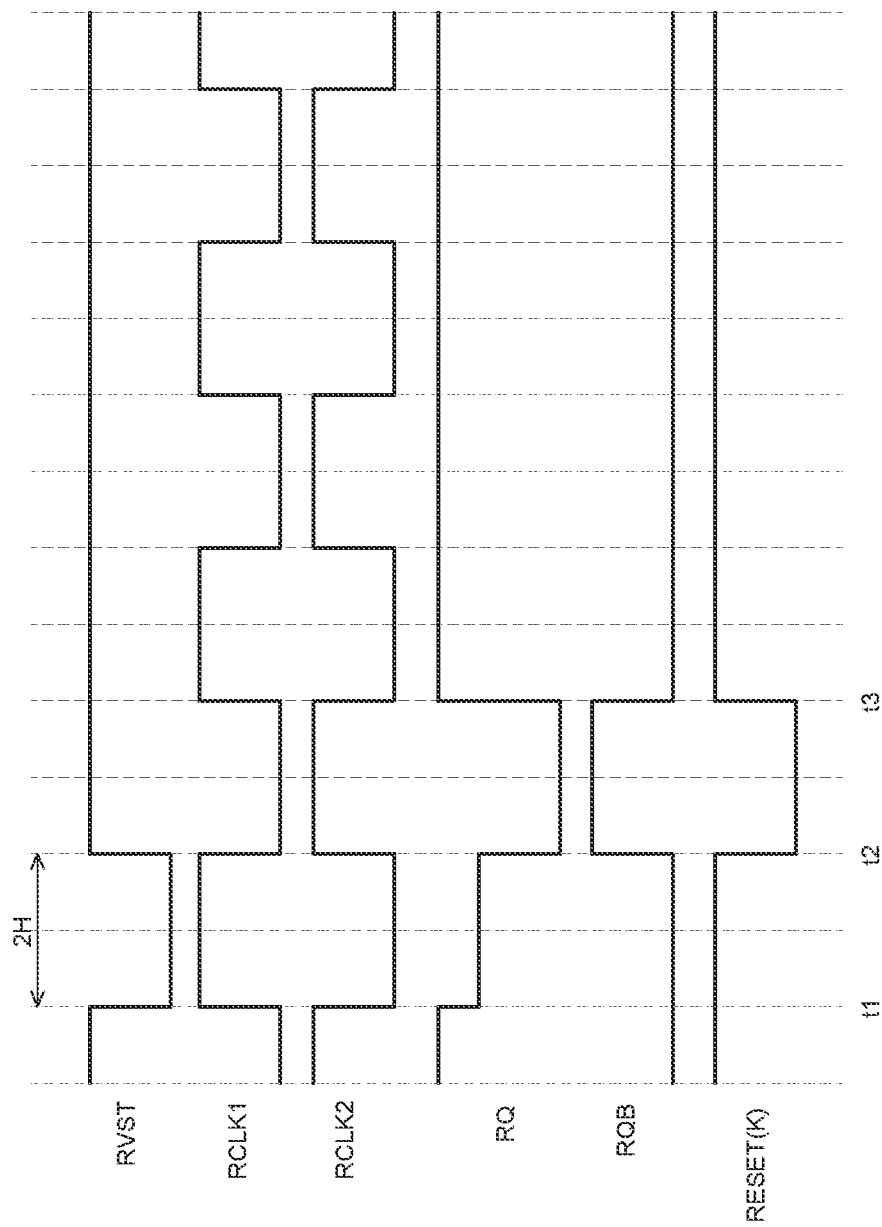
FIG. 10 is a timing chart of an input signal and an output signal of an $N^{th}$ reset driving stage of a display apparatus according to an embodiment of the present disclosure.

FIG. 10 is a timing chart of an input signal and an output signal of a $K^{th}$ reset driving stage of a display apparatus according to an embodiment of the present disclosure.

With reference to FIGS. 9 and 10, a driving method of the $K^{th}$ reset driving stage RGIP(K) will be described in detail.

At a first timing t1, the reset start signal RVST is a low level which is a turn-on level and the second reset clock signal RCLK2 is a low level which is a turn-on level. Therefore, the first reset transistor RT1 is turned on so that the RQ node RQ is discharged to a low level which is a turn-on level. Further, the fourth reset transistor RT4 is turned on so that the RQB node RQB is discharged to a low level which is a turn-on level.

As the RQ node RQ is discharged to a low level which is a turn-on level, the fifth reset transistor RT5 is also turned on so that the RQB node RQB is discharged to a low level which is a turn-on level.

At a second timing t2, the first reset clock signal RCLK1 is a low level which is a turn-on level. Therefore, the RQ node RQ is bootstrapped so that the sixth reset transistor RT6 is turned on and a low level $K^{th}$ reset signal RESET(K) can be output to the $K^{th}$ reset line RL(K).

To be more specific, when the first reset clock signal RCLK1 is discharged to a low level at the second timing t2, due to the parasitic capacitance by the source electrode of the sixth reset transistor RT6 and the RQ node RQ which is the gate electrode, the voltage of the RQ node RQ drops in accordance with the voltage drop of the first reset clock signal RCLK1. The phenomenon that the voltage of the RQ node RQ drops at the second timing t2 is referred to as bootstrapping.

As described above, the RQ node RQ is bootstrapped so that the sixth reset transistor RT6 is fully turned on and a low level $K^{th}$ reset signal RESET(K) can be output to the $K^{th}$ reset line RL(K).

Subsequently, at a third timing t3, the second reset clock signal RCLK2 is a low level which is a turn-on level. Therefore, the first reset transistor RT1 is turned on so that the RQ node RQ is discharged to a high level which is a turn-off level. Further, the fourth reset transistor RT4 is turned on so that the RQB node RQB is discharged to a low level which is a turn-on level.

Therefore, the RQB node RQB is discharged to the low level which is a turn-on level so that the seventh reset transistor RT7 is turned on and a high level $K^{th}$ reset signal RESET (K) can be output to the $K^{th}$ reset line RL(K).

Figure 11:
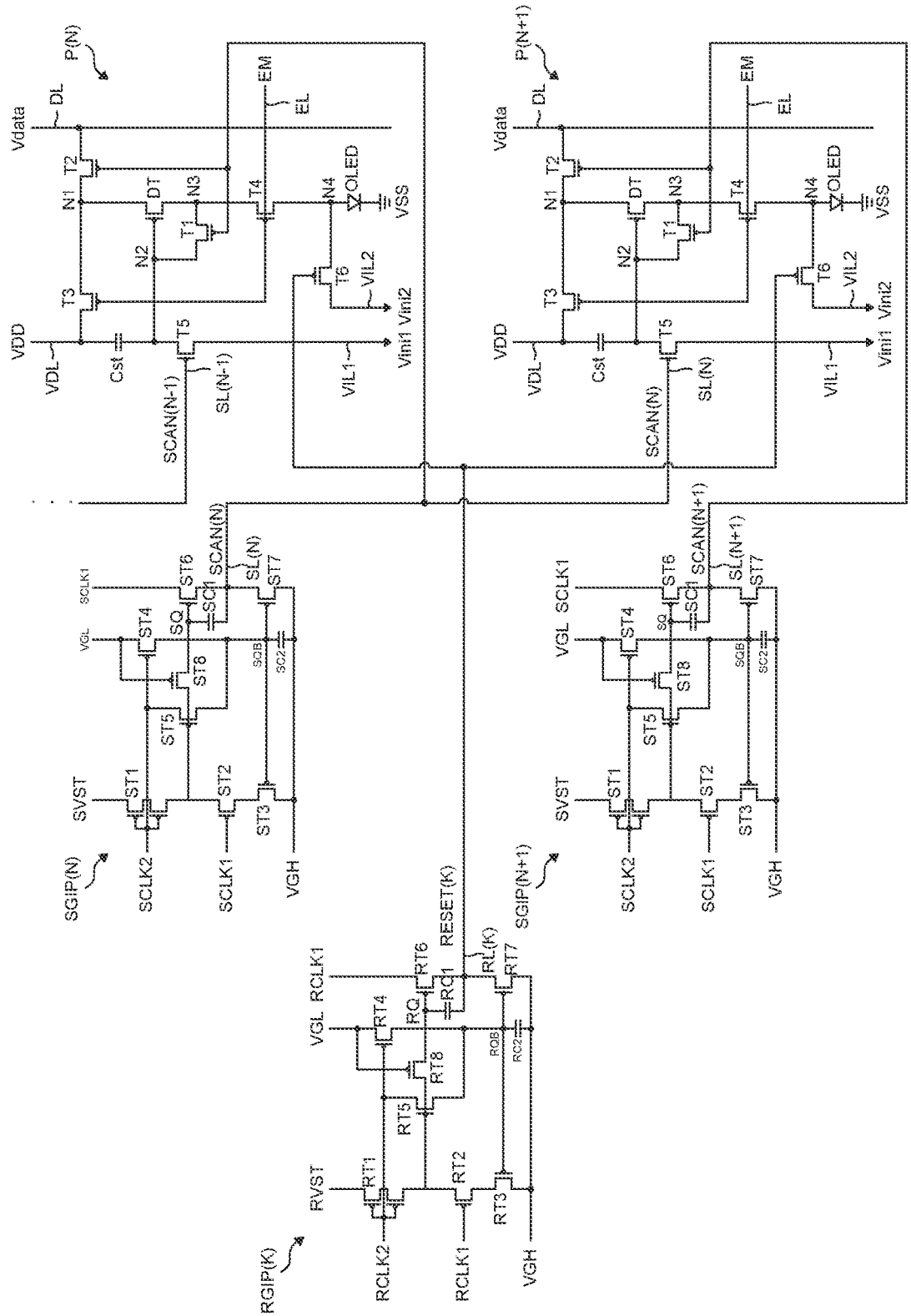
FIG. 11 is a circuit diagram illustrating a connection relationship of a gate driver and a plurality of pixels of a display apparatus according to an embodiment of the present disclosure.

FIG. 11 is a circuit diagram illustrating a connection relationship of a gate driver and a plurality of pixels of a display apparatus according to an embodiment of the present disclosure.

In FIG. 11, circuit diagrams of a $K^{th}$ reset driving stage RGIP(K), an $N^{th}$ scan driving stage SGIP(N), an $N+1^{th}$ scan driving stage SGIP(N+1), the $N^{th}$ pixel P(N), and the $N+1^{th}$ pixel P(N+1) are applied to the block diagram of FIG. 6.

With reference to FIG. 11, the $N^{th}$ scan driving stage SGIP(N) outputs an $N^{th}$ scan signal SCAN(N) to the $N^{th}$ pixel P(N) and the $N+1^{th}$ pixel P(N+1) through the $N^{th}$ scan line SL(N), respectively. For example, the $N^{th}$ scan line SL(N) can be connected to the first transistor T1 and the second transistor T2 of the $N^{th}$ pixel P(N) and can be connected to the fifth transistor of the $N+1^{th}$ pixel P(N+1).

The $N+1^{th}$ scan driving stage SGIP(N+1) outputs an $N+1^{th}$ scan signal SCAN(N+1) to the $N+1^{th}$ pixel P(N+1) through the $N+1^{th}$ scan line SL(N+1). For example, the $N+1^{th}$ scan line SL(N+1) can be connected to the first transistor T1 and the second transistor T2 of the $N+1^{th}$ pixel P(N+1).

The $K^{th}$ reset driving stage RGIP(K) outputs a $K^{th}$ reset signal RESET(K) to the $N^{th}$ pixel P(N) and the $N+1^{th}$ pixel P(N+1) through a $K^{th}$ reset line RL(N), respectively. For example, the $K^{th}$ reset line RL(K) can be connected to the sixth transistor T6 of the $N^{th}$ pixel P(N) and the sixth transistor T6 of the $N+1^{th}$ pixel P(N+1). Therefore, the sixth transistor T6 of the $N^{th}$ pixel P(N) and the sixth transistor T6 of the $N+1^{th}$ pixel P(N+1) are applied with one $K^{th}$ reset signal RESET(K) to be reset.

For example, one $K^{th}$ reset driving stage RGIP(K) can correspond to two pixels, the $N^{th}$ pixel P(N) and the $N+1^{th}$ pixel P(N+1). Accordingly, the number of the plurality of scan driving stages can be twice the number of the plurality of reset driving stages.

In other words, the number of reset driving stages disposed at the gate driver can be reduced by half. Accordingly, in the display apparatus according to an embodiment of the present disclosure, an area of the gate driver disposed at a non-display area is reduced so that the bezel area of the display apparatus can be minimized.

Figure 12:
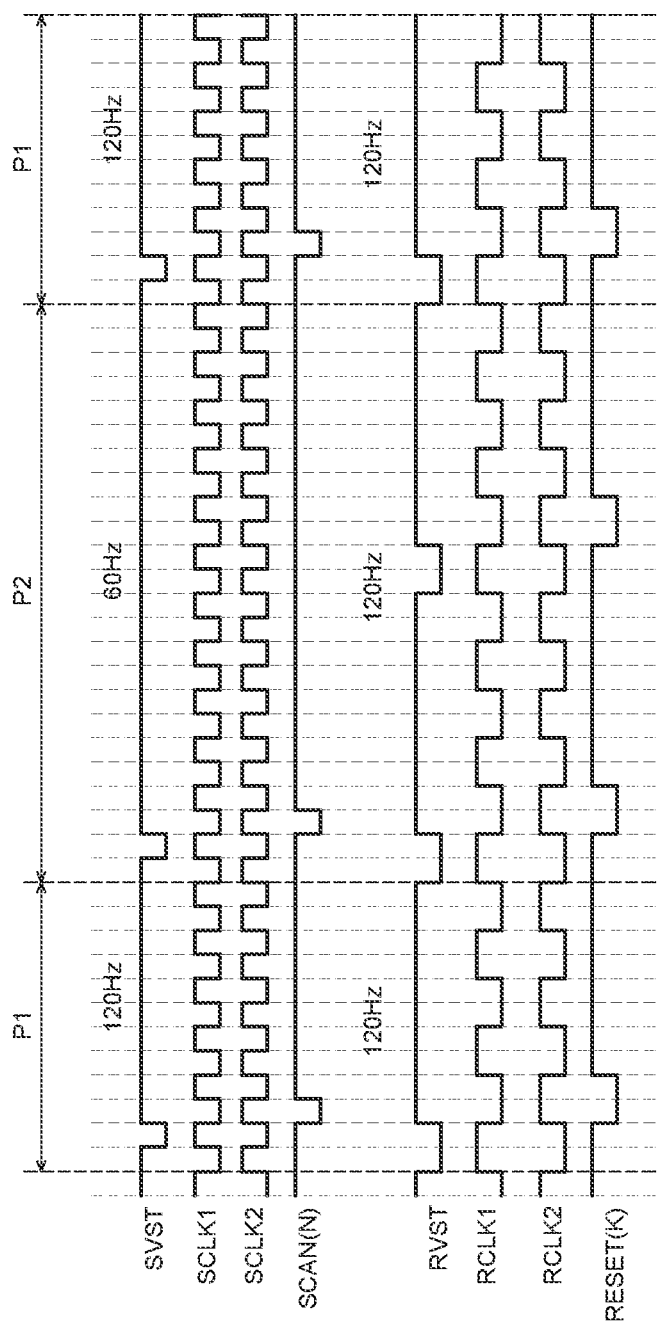
FIG. 12 is a timing chart illustrating an input signal and an output signal of a gate driver in a first period and a second period of a display apparatus according to an embodiment of the present disclosure.

FIG. 12 is a timing chart illustrating an input signal and an output signal of a gate driver in a first period and a second period of a display apparatus according to an embodiment of the present disclosure.

With reference to FIGS. 8 and 10, in order to reset two pixels, the $N^{th}$ pixel P(N) and the $N+1^{th}$ pixel P(N+1), with one $K^{th}$ reset driving stage RGIP(K), a horizontal period of the $K^{th}$ reset signal RESET(K) can be twice the horizontal period of the N-lth scan signal SCAN(N−1) and the $N^{th}$ scan signal SCAN(N).

Therefore, as illustrated in FIG. 12, the horizontal period of each of the reset start signal RVST, the first reset clock signal RCLK1, and the second reset clock signal RCLK2 can be twice the horizontal period of each of the scan start signal SVST, the first scan clock signal SCLK1, and the second scan clock signal SCLK2.

For example, a swing width of each of the first reset clock signal RCLK1 and the second reset clock signal RCLK2 can be twice the swing width of each of the first scan clock signal SCLK1 and the second scan clock signal SCLK2.

The display apparatus according to an embodiment of the present disclosure can be driven at different frequencies.

For example, as illustrated in FIG. 12, the display apparatus according to the exemplary embodiment of the present disclosure can be driven by being divided into a first period P1 driven at 120 Hz and a second period P2 driven at 60 Hz.

In the first period P1, the scan start signal SVST which determines a frequency of the scan signal SCAN(N) is output at 120 Hz and the reset start signal RVST which determines the frequency of the reset signal RESET(K) is output at 120 Hz. Therefore, in the first period P1, the frequency of the scan signal SCAN(N) is output at 120 Hz and the frequency of the reset signal RESET(K) is also output at 120 Hz.

In the second period P2, the scan start signal SVST which determines a frequency of the scan signal SCAN(N) is output at Hz, but the reset start signal RVST which determines the frequency of the reset signal RESET(K) is output at 120 Hz. Therefore, in the second period P2, the frequency of the scan signal SCAN(N) is output at 60 Hz and the frequency of the reset signal RESET(K) is output at 120 Hz.

For example, the scan signal SCAN(N) can be changed depending on the period, but the frequency of the reset signal RESET(K) can be fixed or maintained during both the first period P1 and the second period P2.

In other words, the display apparatus according to an embodiment of the present disclosure separately configures the plurality of scan driving stages SGIP(N) which supplies the scan signal SCAN(N) to the plurality of pixels P(N) and the plurality of reset driving stages RGIP(K) which supplies the reset signal RESET(K) to the plurality of pixels P(N). Accordingly, the frequency of the scan signal SCAN(N) changes in accordance with the driving frequency of the display apparatus but the frequency of the reset signal RESET(K) can be consistently fixed or maintained.

Therefore, in the display apparatus according to an embodiment of the present disclosure, the anode electrode of the light emitting diode can be consistently initialized regardless of the driving frequency.

Figure 13:
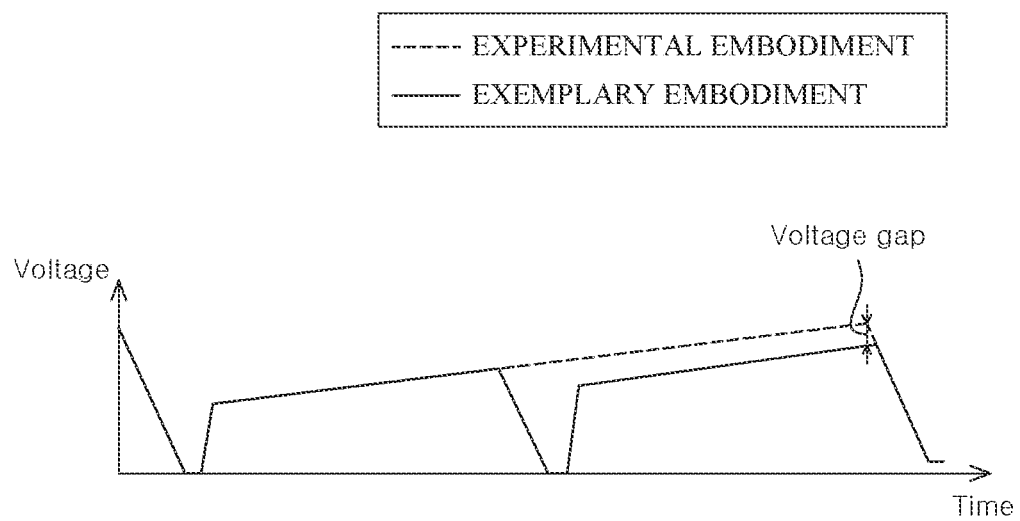
FIG. 13 is a waveform illustrating a voltage of an anode electrode of a display apparatus according to an embodiment of the present disclosure.

FIG. 13 is a waveform illustrating a voltage of an anode electrode of a display apparatus according to an embodiment of the present disclosure.

In an experimental example of the present disclosure, the plurality of reset driving stages RGIP(K) which supplies the reset signal RESET(K) is not separately configured so that the anode electrode can be reset by means of the scan signal SCAN(N). Therefore, the anode electrode is reset by means of the scan signal SCAN(N) of 60 Hz in the second period P2.

As illustrated in FIG. 13, in the experimental example of the present disclosure, the voltage of the anode electrode consistently rises due to the leakage current in the second period P2. For example, in the experimental example of the present disclosure, as compared with an embodiment of the present disclosure, there is a voltage gap of the anode electrode.

In contrast, in an embodiment of the present disclosure, the plurality of reset driving stages RGIP(K) which supplies the reset signal RESET(K) is separately configured so that the anode electrode can be reset by means of the reset signal RESET(K). Therefore, the anode electrode is reset by means of the reset signal RESET(K) of 120 Hz in the second period P2.

Accordingly, in an embodiment of the present disclosure, in the second period P2, the voltage of the anode electrode does not consistently rise due to the leakage current, but is periodically reset.

Accordingly, as illustrated in FIG. 13, in an embodiment of the present disclosure, in the second period P2, the voltage of the anode electrode does not consistently rise due to the leakage current, but is periodically reset so that there is no voltage gap of the anode electrode.

As a result, in the display apparatus according to an embodiment of the present disclosure, the luminance difference which may be caused when the frequency is changed from a frequency of 120 Hz of the first period P1 to a frequency of 60 Hz of the second period P2 is suppressed. Therefore, an image quality variation or color difference in accordance with the frequency change of the display apparatus can be minimized.

Accordingly, in the display apparatus according to an embodiment of the present disclosure, the reset driving stage is added so that the size of the bezel area is increased. For example, a bezel area of a right corner and/or a left corner of the display apparatus in which the gate driver is disposed is increased.

In the display apparatus according to an embodiment of the present disclosure, one reset driving stage does not correspond to one pixel line, but can correspond to two pixel lines. Accordingly, the number of reset driving stages disposed at the gate driver can be reduced by half.

Accordingly, in the display apparatus according to an embodiment of the present disclosure, an area of the gate driver disposed at a non-display area is reduced so that the bezel area of the display apparatus can be minimized.

A display apparatus according to an embodiment of the present disclosure can also be described as follows.

A display apparatus according to an embodiment of the present disclosure includes a display panel including a display area and a non-display area; a plurality of pixels disposed at the display area and includes a light emitting diode; and a gate driver disposed at the non-display area and includes a plurality of scan driving stages configured to output a scan signal, a plurality of emission driving stages configured to output an emission signal, and a plurality of reset driving stages configured to output a reset signal, in which an $N^{th}$ scan driving stage among the plurality of scan driving stages is configured to output an $N^{th}$ scan signal to an $N^{th}$ pixel and an $N+1^{th}$ pixel among the plurality of pixels, an $N+1^{th}$ scan driving stage among the plurality of scan driving stages is configured to output an $N+1^{th}$ scan signal to the $N+1^{th}$ pixel among the plurality of pixels, a $K^{th}$ reset driving stage among the plurality of reset driving stages is configured to output a $K^{th}$ reset signal to the $N^{th}$ pixel and the $N+1^{th}$ pixel (here, N and K are natural numbers equal to or larger than 1, respectively), and an anode electrode of the light emitting diode in each of the $N^{th}$ pixel and the $N+1^{th}$ pixel is initialized in accordance with the $K^{th}$ reset signal.

According to some embodiments of the present disclosure, the $N^{th}$ pixel can include a driving transistor configured to control a driving current applied to the light emitting diode, a first transistor configured to form a diode connection of a gate electrode and a drain electrode of the driving transistor, in response to the $N^{th}$ scan signal, a second transistor configured to apply a data voltage to a source electrode of the driving transistor, in response to the $N^{th}$ scan signal, a third transistor configured to apply a high potential driving voltage to the source electrode of the driving transistor, in response to the emission signal, a fourth transistor configured to form a current path between the driving transistor and the light emitting diode, in response to the emission signal, a fifth transistor configured to apply a first initialization voltage to the gate electrode of the driving transistor, in response to an N-1th scan signal and a sixth transistor configured to apply a second initialization voltage to the anode electrode of the light emitting diode, in response to the $K^{th}$ reset signal.

According to some embodiments of the present disclosure, one frame period can include an initial period, a sampling period, a holding period, and an emission period, the gate electrode of the driving transistor can be initialized with the first initialization voltage during the initial period, the gate electrode of the driving transistor can be charged with a voltage corresponding to a difference between the data voltage and a threshold voltage of the driving transistor during the sampling period, the gate electrode of the driving transistor can be maintained at the voltage corresponding to a difference between the data voltage and the threshold voltage of the driving transistor during the holding period, and a driving current can be applied to the light emitting diode and the light emitting diode is configured to emit light during the emission period.

According to some embodiments of the present disclosure, during two periods among the initial period, the sampling period, and the holding period, the anode electrode of the light emitting diode can be initialized with the second initialization voltage.

According to some embodiments of the present disclosure, a holding period of the $N^{th}$ pixel can overlap a sampling period of the $N+1^{th}$ pixel.

According to some embodiments of the present disclosure, a sampling period of the $N^{th}$ pixel can overlap an initial period of the $N+1^{th}$ pixel.

According to some embodiments of the present disclosure, a frequency of the scan signal is variable and a frequency of the reset signal can be maintained.

According to some embodiments of the present disclosure, a horizontal period of the reset signal can be twice the horizontal period of the scan signal.

According to some embodiments of the present disclosure, the number of the plurality of scan driving stages can be twice the number of the plurality of reset driving stages.

According to some embodiments of the present disclosure, the $N^{th}$ scan driving stage can be applied with a scan start signal, a first scan clock signal, and a second scan clock signal and the $K^{th}$ reset driving stage can be applied with a reset start signal, a first reset clock signal, and a second reset clock signal.

According to some embodiments of the present disclosure, a swing width of each of the first reset clock signal and the second reset clock signal can be twice the swing width of each of the first scan clock signal and the second scan clock signal.

According to some embodiments of the present disclosure, a frequency of the scan start signal is variable and a frequency of the reset start signal can be maintained.

It will be apparent to those skilled in the art that various modifications and variations can be made in the display apparatus of the present disclosure without departing from the technical idea or scope of the disclosures. Thus, it is intended that embodiments of the present disclosure cover the modifications and variations of the disclosure provided they come within the scope of the appended claims and their equivalents.

What is claimed is:
1. A display apparatus, comprising:
   a display panel including a display area and a non-display area;
   a plurality of pixels disposed at the display area and including a light emitting diode; and a gate driver disposed at the non-display area and including a plurality of scan driving stages configured to output scan signals, a plurality of emission driving stages configured to output emission signals, and a plurality of reset driving stages configured to output reset signals, wherein an $N^{th}$ scan driving stage among the plurality of scan driving stages is configured to output an $N^{th}$ scan signal to an $N^{th}$ pixel and an $N+1^{th}$ pixel among the plurality of pixels, where N is a natural number equal to or greater than 1, wherein an $N+1^{th}$ scan driving stage among the plurality of scan driving stages is configured to output an $N+1^{th}$ scan signal to the $N+1^{th}$ pixel among the plurality of pixels, wherein a $K^{th}$ reset driving stage among the plurality of reset driving stages is configured to output a $K^{th}$ reset signal to the $N^{th}$ pixel and the $N+1^{th}$ pixel, where K is a natural number equal to or greater than 1, and wherein an anode electrode of the light emitting diode in each of the $N^{th}$ pixel and the $N+1^{th}$ pixel is initialized in accordance with the $K^{th}$ reset signal, wherein the $N^{th}$ pixel comprises:

a driving transistor configured to control a driving current applied to the light emitting diode;

a first transistor configured to form a diode connection of a gate electrode and a drain electrode of the driving transistor, in response to the $N^{th}$ scan signal;

a second transistor configured to apply a data voltage to a source electrode of the driving transistor, in response to the $N^{th}$ scan signal;

a third transistor configured to apply a high potential driving voltage to the source electrode of the driving transistor, in response to the emission signal;

a fourth transistor configured to form a current path between the driving transistor and the light emitting diode, in response to the emission signal;

a fifth transistor configured to apply a first initialization voltage to the gate electrode of the driving transistor, in response to an $N-1^{th}$ scan signal; and a sixth transistor configured to apply a second initialization voltage to the anode electrode of the light emitting diode, in response to the $K^{th}$ reset signal.

2. The display apparatus of claim 1, wherein one frame period includes an initial period, a sampling period, a holding period, and an emission period, the gate electrode of the driving transistor is initialized with the first initialization voltage during the initial period, the gate electrode of the driving transistor is charged with a voltage corresponding to a difference between the data voltage and a threshold voltage of the driving transistor during the sampling period, the gate electrode of the driving transistor is maintained at the voltage corresponding to a difference between the data voltage and the threshold voltage of the driving transistor during the holding period, and a driving current is applied to the light emitting diode and the light emitting diode is configured to emit light during the emission period.

3. The display apparatus of claim 2, wherein during two periods among the initial period, the sampling period, and the holding period, the anode electrode of the light emitting diode is initialized with the second initialization voltage.

4. The display apparatus of claim 2, wherein a holding period of the $N^{th}$ pixel overlaps a sampling period of the $N+1^{th}$ pixel.

5. The display apparatus of claim 2, wherein a sampling period of the $N^{th}$ pixel overlaps an initial period of the $N+1^{th}$ pixel.

6. The display apparatus of claim 1, wherein a frequency of the scan signal is variable and a frequency of the reset signal is maintained.

7. The display apparatus of claim 1, wherein a horizontal period of the reset signal is twice a horizontal period of the scan signal.

8. The display apparatus of claim 1, wherein the number of the plurality of scan driving stages is twice the number of the plurality of reset driving stages.

9. The display apparatus of claim 1, wherein the $N^{th}$ scan driving stage is applied with a scan start signal, a first scan clock signal, and a second scan clock signal, and wherein the $K^{th}$ reset driving stage is applied with a reset start signal, a first reset clock signal, and a second reset clock signal.

10. The display apparatus of claim 9, wherein a swing width of each of the first reset clock signal and the second reset clock signal is twice a swing width of each of the first scan clock signal and the second scan clock signal.

11. The display apparatus of claim 9, wherein a frequency of the scan start signal is variable and a frequency of the reset start signal is maintained.

* * * * *